(12) United States Patent
Sakai

(10) Patent No.: US 9,874,612 B2
(45) Date of Patent: Jan. 23, 2018

(54) APPARATUS AND METHOD FOR MEASURING IMPEDANCE OF LAMINATED BATTERY

(71) Applicant: NISSAN MOTOR CO., LTD., Yokohama-shi, Kanagawa (JP)

(72) Inventor: Masanobu Sakai, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 21 days.

(21) Appl. No.: 14/914,697

(22) PCT Filed: Jul. 22, 2014

(86) PCT No.: PCT/JP2014/069373
§ 371 (c)(1),
(2) Date: Feb. 26, 2016

(87) PCT Pub. No.: WO2015/029647
PCT Pub. Date: Mar. 5, 2015

(65) Prior Publication Data
US 2016/0202326 A1 Jul. 14, 2016

(30) Foreign Application Priority Data
Aug. 29, 2013 (JP) .................................. 2013-177827

(51) Int. Cl.
G01R 31/36 (2006.01)
(52) U.S. Cl.
CPC ................ *G01R 31/3662* (2013.01)

(58) Field of Classification Search
CPC combination set(s) only.
See application file for complete search history.

(56) References Cited

U.S. PATENT DOCUMENTS 6,331,780 B1 12/2001 Hiroshima et al.
2005/0287402 A1* 12/2005 Maly ................. H01M 8/04291
702/65

(Continued)

FOREIGN PATENT DOCUMENTS

JP    3003659 U    10/1994
JP    11-17291 A    1/1999
(Continued)

*Primary Examiner* — Clayton E Laballe
*Assistant Examiner* — Jas Sanghera
(74) *Attorney, Agent, or Firm* — Foley & Lardner LLP

(57) ABSTRACT

An apparatus for measuring an impedance of a laminated battery includes a laminated battery in which a plurality of power generating elements is laminated; a load connected to both ends of the laminated battery; a resistance component provided between the superimposing unit and the load; and a potential difference suppressing circuit that suppresses a pulsating potential difference between both ends of the resistance component. A superimposing unit superimposes a pulsating current or a pulsating voltage on an output of the laminated battery. An impedance measuring unit measures an internal impedance of the laminated battery on the basis of when the pulsating current is superimposed, the pulsating current and a pulsating voltage generated by superimposing the pulsating current, or on the basis of, when the pulsating voltage is superimposed, the pulsating voltage and a pulsating current generated by superimposing the pulsating voltage.

7 Claims, 6 Drawing Sheets

(56) References Cited

U.S. PATENT DOCUMENTS

2009/0117427 A1* 5/2009 Manabe ............ H01M 8/04649
                                                            429/430
2013/0249562 A1    9/2013 Sakai et al.

FOREIGN PATENT DOCUMENTS

| JP | 2000-515253 A | 11/2000 |
| JP | 2004-325337 A | 11/2004 |
| WO | WO 2012/077450 A1 | 6/2012 |

* cited by examiner

APPARATUS AND METHOD FOR MEASURING IMPEDANCE OF LAMINATED BATTERY

TECHNICAL FIELD

The present invention relates to an apparatus and method for measuring an internal impedance of a laminated battery.

BACKGROUND ART

In a laminated battery in which a plurality of power generating elements is laminated, it is preferable to detect an internal resistance as accurately as possible. For example, in a fuel cell, if the internal resistance is detected, then a degree of wetness of an electrolyte membrane can be known. In a case where the internal resistance is high, the degree of wetness of the electrolyte membrane is low and rather dry. In a case where the internal resistance is low, the degree of wetness of the electrolyte membrane is high. In a fuel cell, operating efficiency changes depending on the degree of wetness of the electrolyte membrane. Thus, by controlling the operation in accordance with the degree of wetness of the electrolyte membrane estimated on the basis of the internal resistance, a wetness condition of the electrolyte membrane can be constantly maintained in an optimal state.

In order to detect the wetness condition of the electrolyte membrane, a technology is known in which an alternating current is supplied by an external circuit to a fuel cell that is connected to an external load to measure an impedance of the fuel cell. However, with respect to the external circuit that supplies the alternating current, the battery and the load that is connected to the battery form a parallel circuit. Thus, in a case where the supplied current flows to the load other than the battery, there is a possibility that the internal resistance of the battery cannot be measured accurately. An apparatus for solving this problem is disclosed in WO2012/077450A.

SUMMARY OF INVENTION

In a case where supplied current flows to the load other than the battery when an alternating current is supplied by the external circuit to the laminated battery as described above, there is a possibility that the internal resistance of the battery cannot be measured accurately.

It is an object of the present invention to provide a technology for precisely measuring an impedance of a laminated battery by a method other than that disclosed in WO2012/077450A.

According to the present invention, there is provided an apparatus for measuring an impedance of a laminated battery, including: a laminated battery in which a plurality of power generating elements is laminated; a load connected to both ends of the laminated battery; a superimposing unit configured to superimpose a pulsating current or a pulsating voltage on an output of the laminated battery; and an impedance measuring unit configured to measure, when the pulsating current is superimposed on the output, an internal impedance of the laminated battery on the basis of the pulsating current and a pulsating voltage generated by superimposing the pulsating current, the impedance measuring unit being configured to measure, when the pulsating voltage is superimposed on the output, on the basis of the pulsating voltage and a pulsating current generated by superimposing the pulsating voltage. The apparatus for measuring an impedance of a laminated battery further includes a resistance component provided between the superimposing unit and the load; and a potential difference suppressing circuit configured to suppress a pulsating potential difference between both ends of the resistance component.

Embodiments of the present invention will be described below in detail with reference to the appending drawings.

DESCRIPTION OF EMBODIMENTS

First Embodiment

Figure 1:
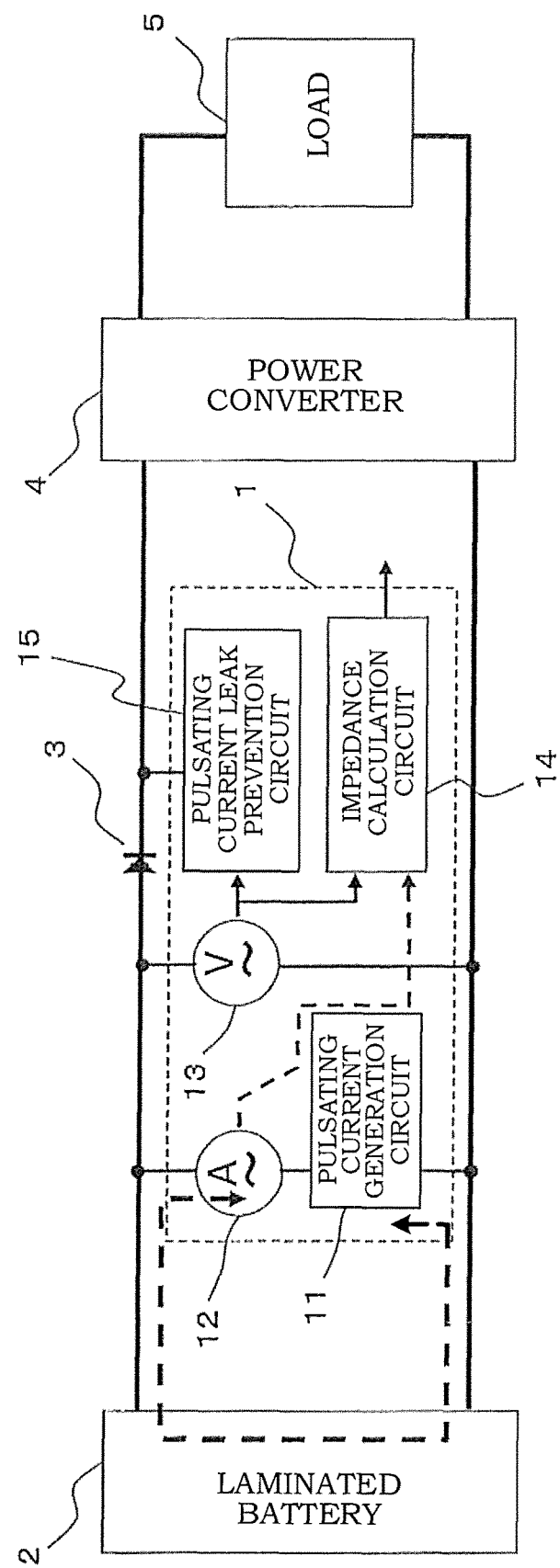
FIG. 1 illustrates a basic configuration of an apparatus for measuring an impedance for a laminated battery according to a first embodiment.

FIG. 1 illustrates a basic configuration of an apparatus for measuring an impedance for a laminated battery according to a first embodiment. A laminated battery 2 is a battery in which a plurality of power generating elements is laminated. For example, the laminated battery 2 is a fuel cell stack in which a plurality of fuel cells is laminated.

A power converter 4 is provided between the laminated battery 2 and a load 5, and converts electric power supplied from the laminated battery 2 to electric power to be supplied to the load 5. For example, in a case where the load 5 is a three-phase AC motor, the power converter 4 is an inverter that converts DC electric power supplied from the laminated battery 2 to three-phase AC electric power and supplies the converted electric power to the load 5. Further, in a case where the load 5 is a DC motor, the power converter 4 is a DC/DC converter that converts a DC voltage supplied from the laminated battery 2 to a desired DC voltage and applies the converted voltage to the load 5.

A diode 3 for preventing a current from flowing from the power converter 4 side to the laminated battery 2 is provided between the laminated battery 2 and the power converter 4. Namely, an anode of the diode 3 is connected to an output terminal of the laminated battery 2, and a cathode is connected to an input terminal of the power converter 4.

A pulsating current generating circuit 11, a pulsating current detector 12, and a pulsating voltage detector 13 are provided between the laminated battery 2 and the diode 3. However, the pulsating voltage detector 13 may be provided between the diode 3 and the power converter 4.

The pulsating current generating circuit 11 generates a pulsating current. The pulsating current thus generated is supplied to the laminated battery 2 and superimposed on an output current of the laminated battery 2.

The pulsating current detector 12 detects the pulsating current generated by the pulsating current generating circuit 11. The pulsating voltage detector 13 is connected in parallel with the laminated battery 2, and detects a pulsating voltage generated between both ends of the laminated battery 2 by the pulsating current.

An impedance calculating circuit 14 calculates an internal impedance of the laminated battery 2 by dividing the pulsating voltage detected by the pulsating voltage detector 13 by the pulsating current detected by the pulsating current detector 12.

A pulsating current leak preventing circuit 15 is a circuit for preventing the pulsating current generated by the pulsating current generating circuit 11 from flowing to the load 5 side via the diode 3.

Figure 2:
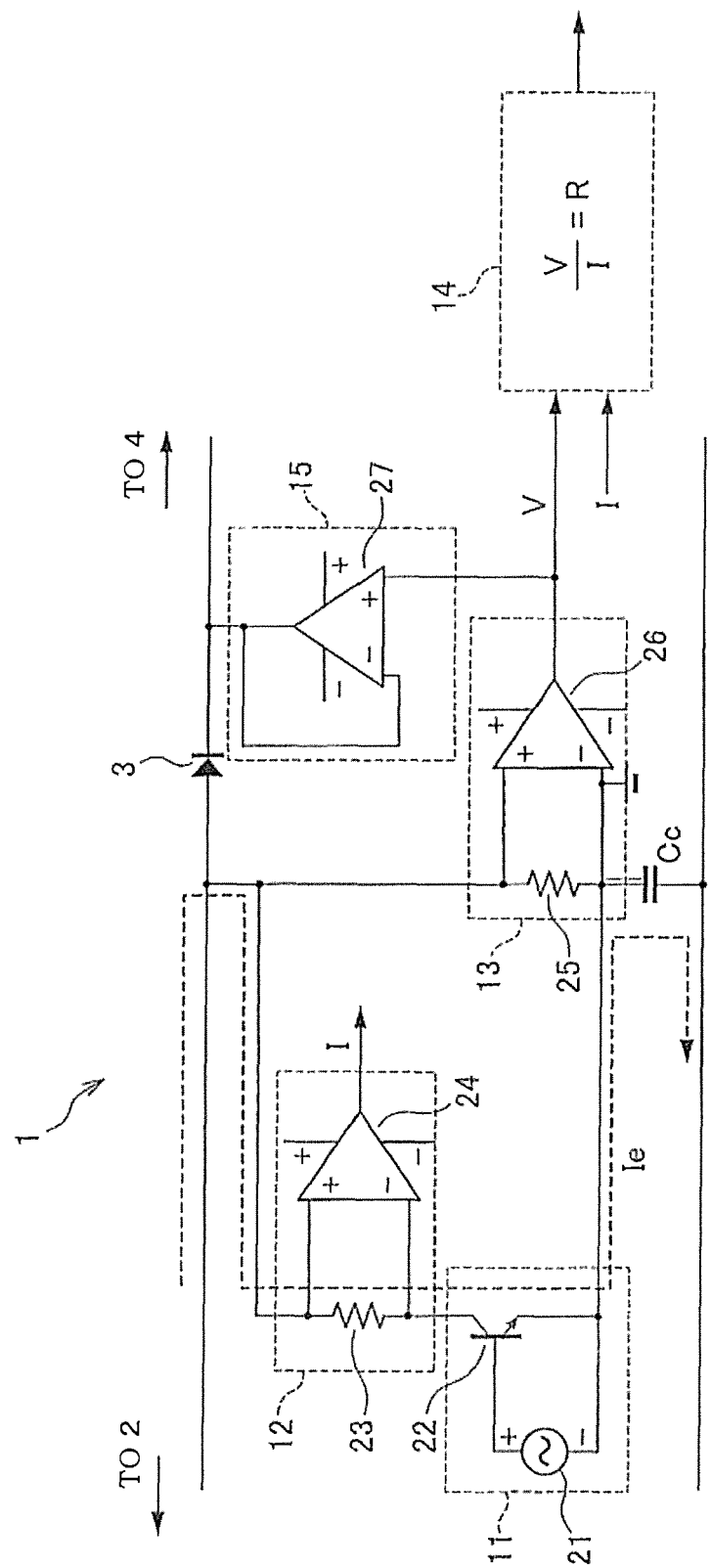
FIG. 2 illustrates a partial concrete configuration of the apparatus for measuring an impedance for a laminated battery according to the first embodiment.

FIG. 2 illustrates a partial concrete configuration of the apparatus for measuring an impedance for a laminated battery according to the first embodiment. In FIG. 2, the laminated battery 2, the power converter 4, and the load 5 are omitted.

In the circuit shown in FIG. 2, a capacitor Cc is connected to the pulsating voltage detector 13 in series. The capacitor Cc allows only a pulsating current to pass therethrough, and generates an operation reference potential (common voltage) of the respective circuits (the pulsating current generating circuit 11, the pulsating current detector 12, the pulsating voltage detector 13, the impedance calculating circuit 14, and the pulsating current leak preventing circuit 15). Namely, a charge of a DC voltage component of the laminated battery 2 is accumulated in the capacitor Cc, and a connection point between the pulsating voltage detector 13 and the capacitor Cc becomes the operation reference potential of the respective circuits.

The pulsating current generating circuit 11 includes a pulsating signal source 21 and an NPN-type transistor 22. An emitter of the NPN-type transistor 22 is connected to the connection point between the pulsating voltage detector 13 and the capacitor Cc, and a collector is connected to one end of a resistor 23 of the pulsating current detector 12 (will be described later). The pulsating signal source 21 is a sine wave generator, for example. When a sine wave current generated by the pulsating signal source 21 is supplied to a base of the NPN-type transistor 22, the NPN-type transistor 22 is driven and a pulsating current Ie flows in a direction from the collector to the emitter, that is, along a route indicated by an arrow in FIG. 2.

The pulsating current detector 12 includes a resistor 23 whose resistance value is Ri, and an operational amplifier 24. The operational amplifier 24 detects a potential difference Vopi generated between both ends of the resistor 23 when the pulsating current Ie flows thereto, and outputs a pulsating current value I that is calculated by the following Equation (1).

[Eq. 1]

$$I = Vopi/Ri \quad (1)$$

The pulsating voltage detector 13 includes a resistor 25 whose resistance value is Rv (Ri<Rv), and an operational amplifier 26. The pulsating voltage detector 13 is connected in parallel to the pulsating current generating circuit 11 and the pulsating current detector 12 that are connected in series. When the pulsating current Ie flows in the direction indicated by the arrow in FIG. 2, a voltage equal to the voltage generated between both ends of the pulsating current generating circuit 11 and the pulsating current detector 12 that are connected in series is generated between both ends of the resistor 25. The operational amplifier 26 detects a potential difference Vopv generated between the both ends of the resistor 25, and outputs the potential difference Vopv as a pulsating voltage value V (V=Vopv). The pulsating voltage value V, which is an output of the operational amplifier 26, is inputted into the impedance calculating circuit 14 and the pulsating current leak preventing circuit 15.

The pulsating current leak preventing circuit 15 includes a voltage follower amplifier 27. The voltage follower amplifier 27 has characteristics for outputting a voltage equal to an input voltage. When the pulsating voltage value V, which is the output of the operational amplifier 26, is inputted, the voltage follower amplifier 27 outputs the same voltage V to a cathode side of both ends of the diode 3. Namely, when a pulsating current flows, the voltage follower amplifier 27 applies a voltage equal to the pulsating voltage generated on an anode side of the diode 3 to the cathode side of the diode 3. This causes a potential difference of the pulsating voltage between the anode and the cathode of the diode 3 to become zero. Therefore, the pulsating current no longer flows to the diode 3. Namely, the pulsating current can be prevented from flowing to the power converter 4 and the load 5 via the diode 3.

In a case where a direct current is flowing from the laminated battery 2 to the load 5 via the diode 3, the voltage on an output terminal side of the voltage follower amplifier 27 may fluctuate. However, the voltage follower amplifier 27 operates so that the input voltage and an output voltage immediately become equal by means of negative feedback. This makes it possible to precisely maintain the pulsating voltage potential difference between the anode and the cathode of the diode 3 at zero.

As explained above, the apparatus for measuring an impedance of a laminated battery according to the first embodiment includes: the laminated battery 2 in which a plurality of power generating elements is laminated; the load 5 connected to both ends of the laminated battery 2; the pulsating current generating circuit 11 that superimposes the pulsating current on the output of the laminated battery 2; the impedance calculating circuit 14 that measures the internal impedance of the laminated battery 2 on the basis of the pulsating current and the pulsating voltage generated by superimposing the pulsating current; the diode 3 that serves as a resistance component provided between the pulsating current generating circuit 11 and the load 5; and the pulsating current leak preventing circuit 15 that suppresses the pulsating potential difference between the both ends of the diode 3. By suppressing the pulsating potential difference between the both ends of the resistance component by means of the pulsating current leak preventing circuit 15, the pulsating current can be prevented from flowing to the load 5 side via the resistance component. Therefore, the internal impedance of the laminated battery 2 can be precisely measured on the basis of the pulsating current and the pulsating voltage.

In particular, according to the apparatus for measuring an impedance of a laminated battery of the first embodiment, the pulsating current leak preventing circuit 15 suppresses the generation of a pulsating potential difference between the both ends of the diode 3 by applying the pulsating voltage to the load-side end of the both ends of the diode 3. Namely, by applying the voltage equal to the pulsating voltage generated at the laminated battery-side end of the both ends of the diode 3 to the load-side end of the diode 3, the pulsating voltage potential difference between the both ends of the diode 3 can be suppressed effectively.

Second Embodiment

Figure 3:
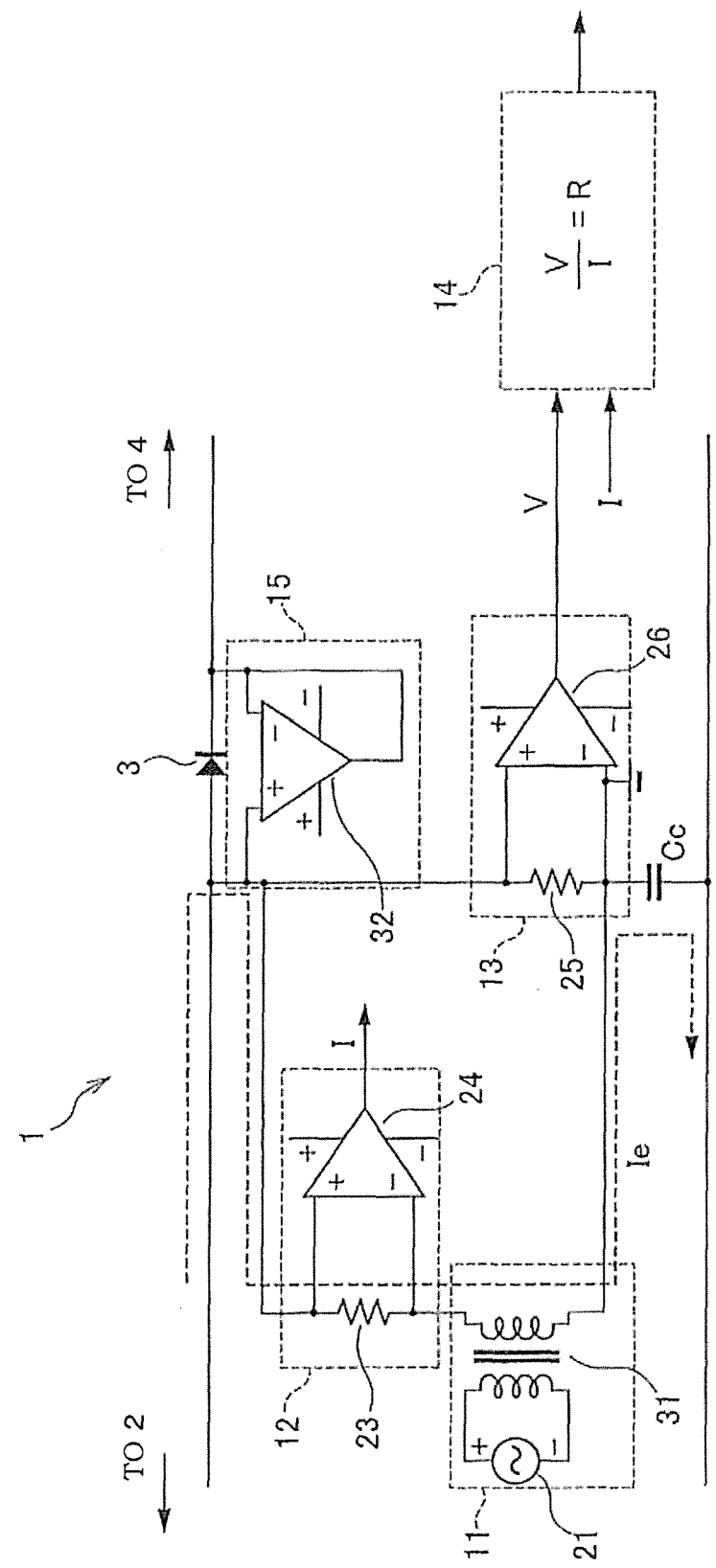
FIG. 3 illustrates a partial concrete configuration of an apparatus for measuring an impedance for a laminated battery according to a second embodiment.

FIG. 3 illustrates a partial concrete configuration of an apparatus for measuring an impedance for a laminated battery according to a second embodiment. In FIG. 3, a laminated battery 2, a power converter 4, and a load 5 are also omitted. Further, the same reference numerals will be assigned to constituent portions that are the same as those in the configuration of the apparatus for measuring an impedance for a laminated battery according to the first embodiment shown in FIG. 2, and detailed explanation thereof will be omitted.

A pulsating current generating circuit 11 includes a pulsating signal source 21 and a transformer 31. A primary coil of the transformer 31 is connected to the pulsating signal source 21 in series. Further, one end of a secondary coil of the transformer 31 is connected to one end of a resistor 23 of a pulsating current detector 12, and the other end is connected to a connection point between a pulsating voltage detector 13 and a capacitor Cc. When a sine wave current generated by the pulsating signal source 21 flows to the primary coil of the transformer 31, a current with the same wave form also flows to the secondary coil. Thus, a pulsating current Ie flows along a route indicated by an arrow in FIG. 3. By an action of the transformer 31, the pulsating current Ie becomes a bipolar wave form including positive and negative current components.

A pulsating current leak preventing circuit 15 is a negative feedback amplifier circuit including an operational amplifier 32. Namely, an output terminal and an inverted input terminal of the operational amplifier 32 are connected. Further, a non-inverted input terminal of the operational amplifier 32 is connected to an anode of a diode 3, and the inverted input terminal of the operational amplifier 32 is connected to a cathode of the diode 3. The negative feedback amplifier circuit has characteristics (imaginary short) that a potential difference between the inverted input terminal and the non-inverted input terminal of the operational amplifier 32 is maintained so as to become zero. For this reason, a pulsating voltage potential difference between the anode and the cathode of the diode 3 becomes zero. This causes the pulsating current to no longer flow to the diode 3, and thus, the pulsating current can be prevented from flowing to a load 5 side via the diode 3.

As described above, according to the apparatus for measuring an impedance of a laminated battery of the second embodiment, the pulsating current leak preventing circuit 15 is the negative feedback amplifier circuit including the non-inverted input terminal connected to a laminated battery-side end of the both ends of the diode 3, the inverted input terminal connected to a load-side end, and an output terminal connected to the inverted input terminal. Since the negative feedback amplifier circuit has characteristics that the potential difference between the inverted input terminal and the non-inverted input terminal is maintained so as to become zero, it is possible to suppress a pulsating voltage potential difference between the both ends of the diode 3 from being generated, and this makes it possible to suppress a pulsating current from flowing to the load 5 side via the diode 3.

Further, the pulsating current generating circuit 11 has the pulsating signal source 21 that generates a pulsating current, and the transformer 31 including the primary coil connected to the pulsating signal source 21 and the secondary coil connected to a circuit in which an output current of the laminated battery 2 flows. In this configuration, the pulsating current can also be superimposed on the output of the laminated battery 2.

Third Embodiment

In an apparatus for measuring an impedance for a laminated battery according to a third embodiment, a configuration of a pulsating current generating circuit 11 differs from the configuration of the pulsating current generating circuit 11 of the apparatus for measuring an impedance for a laminated battery according to the first and second embodiments.

Figure 4:
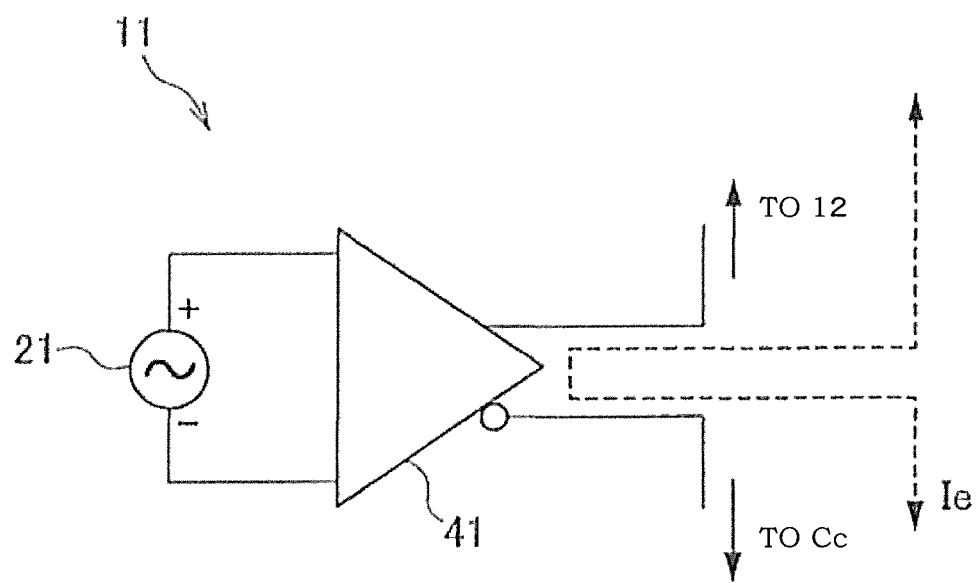
FIG. 4 illustrates a configuration of a pulsating current generating circuit in an apparatus for measuring an impedance for a laminated battery according to a third embodiment.

FIG. 4 illustrates a configuration of the pulsating current generating circuit 11 in the apparatus for measuring an impedance for a laminated battery according to the third embodiment. The pulsating current generating circuit 11 includes a pulsating signal source 21 and a differential amplifier 41.

Two input terminals of the differential amplifier 41 are connected to output terminals of the pulsating signal source 21, respectively. Namely, the differential amplifier 41 amplifies a voltage difference generated between the two input terminals due to a sine wave current generated by the pulsating signal source 21, and outputs the amplified voltage difference. At this time, depending on characteristics of the differential amplifier 41, a pulsating current Ie flows in both directions as shown by an arrow in FIG. 4. A current value I of the pulsating current Ie is proportional to a current value of a pulsating current generated by the pulsating signal source 21, but the current value of the pulsating current generated by the pulsating signal source 21 and a differential gain of the differential amplifier 41 can be grasped in advance. For this reason, the current value I of the pulsating current Ie can be found by calculation. Namely, according to the configuration of the present embodiment, it is no need to detect the current value of the pulsating current by means of the pulsating current detector 12, and thus, it can be configured so as to omit the pulsating current detector 12.

As described above, according to the apparatus for measuring an impedance of a laminated battery of the third embodiment, the pulsating current generating circuit 11 includes: the pulsating signal source 21 that generates a pulsating current; and the differential amplifier 41 that has the two input terminals connected to the both ends of the pulsating signal source 21. Since the pulsating current outputted from the differential amplifier 41 is proportional to the current value of the pulsating current generated by the pulsating signal source 21, the current value I of the pulsating current Ie can be found by calculation. This makes it possible to configure the apparatus so as to omit the pulsating current detector 12 for detecting the current value of the pulsating current Ie.

In this regard, the same effects can be obtained even if a current transformer or a push-pull circuit including two transistors is used in place of the differential amplifier 41. For example, in case of using a current transformer, a primary side thereof is connected to the pulsating signal source 21 in series, and a current that is proportional to the pulsating current generated by the pulsating signal source 21 flows to a secondary side thereof. Thus, since it is no need to detect the current value of the pulsating current by means of the pulsating current detector 12, it can be configured so as to omit the pulsating current detector 12. Further, in case of using a push-pull circuit including two transistors of an NPN transistor and a PNP transistor, it is possible to cause the pulsating current Ie to flow in both directions as shown by the arrow in FIG. 4 as well as the case of using the differential amplifier 41. In addition, a voltage difference generated between two input terminals due to a sine wave current generated by the pulsating signal source 21 can be amplified and then outputted. For this reason, as well as the case of using the differential amplifier 41, it can be configured so as to omit the pulsating current detector 12.

Fourth Embodiment

In an apparatus for measuring an impedance for a laminated battery according to the fourth embodiment, a configuration of a pulsating current generating circuit 11 differs from the configuration of the pulsating current generating circuit 11 of the apparatus for measuring an impedance for a laminated battery according to the first to third embodiments.

Figure 5:
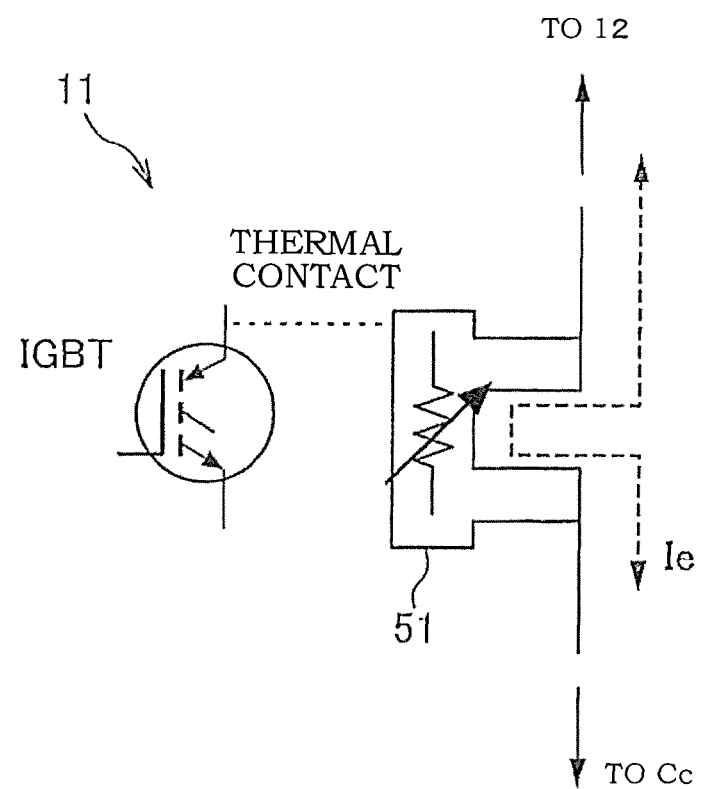
FIG. 5 illustrates a configuration of a pulsating current generating circuit in an apparatus for measuring an impedance for a laminated battery according to a fourth embodiment.

FIG. 5 illustrates a configuration of the pulsating current generating circuit 11 in the apparatus for measuring an impedance for a laminated battery according to the fourth embodiment. The pulsating current generating circuit 11 includes a thermoelectric element 51. The thermoelectric element 51 is an element that converts thermal energy to electrical energy, such as a Seebeck element, a thermistor, a thermocouple, or a Peltier element. Hereinafter, a case where a thermistor whose resistance value changes in accordance with a temperature change is used as the thermoelectric element 51 will be explained.

The thermoelectric element 51 is provided in the vicinity of a power switching element (for example, an IGBT) of a power converter 4. Heat is generated when the power switching element of the power converter 4 is turned on. Thus, when the power switching element is turned on/off in a driving period (PWM period) according to a PWM signal, a temperature pulsation (temperature change) according to this driving period is conducted to the thermoelectric element 51. The resistance of the thermistor that is the thermoelectric element 51 also changes in proportion to this temperature pulsation (temperature change). Therefore, a current that is proportional to the temperature pulsation, that is, a pulsating current flows to the thermoelectric element 51 by using the laminated battery 2 as a voltage source.

Each of a Seebeck element, a thermocouple, and a Peltier element has characteristics that an electromotive force according to a temperature difference is generated. In a case where a Seebeck element, a thermocouple, or a Peltier element is used as the thermoelectric element 51, a temperature pulsation according to the driving period of the power switching element of the power converter 4 is conducted to the thermoelectric element 51, and the thermoelectric element 51 generates an electromotive force according to this temperature pulsation. Thus, a pulsating current according to this electromotive force flows to the thermoelectric element 51.

Here, for example, in a case where the apparatus for measuring an impedance of a laminated battery is installed and used in a vehicle such as an electric vehicle or a fuel-cell vehicle, a voltage between terminals of the laminated battery becomes several hundred volts. In such a case, loss of the power switching element when the power converter 4 converts a large amount of power becomes great. Noise becomes larger when the power switching element is turned on, but the temperature change conducted from the power switching element to the thermoelectric element 51 also becomes larger. Since an amplitude of the pulsating current Ie increases as a result, an SN ratio is improved without the use of an external device or the like for improving the SN ratio.

As described above, according to the apparatus for measuring an impedance of a laminated battery of the fourth embodiment, the pulsating current generating circuit 11 includes the thermoelectric element 51 that generates the pulsating current due to thermal fluctuation according to the switching of the switching element included in the power converter 4 provided between the pulsating current generating circuit 11 and the load 5. In such a configuration, the pulsating current can also be superimposed on an output of the laminated battery. Further, as explained above, in a case where the power converter 4 converts a large amount of power, the noise becomes larger when the switching element is turned on, but the temperature change conducted from the switching element to the thermoelectric element 51 also becomes larger. For this reason, the amplitude of the pulsating current Ie becomes larger as a result. Thus, it is possible to achieve an effect in which the SN ratio is improved without the use of an external device or the like for improving the SN ratio.

Figure 6:
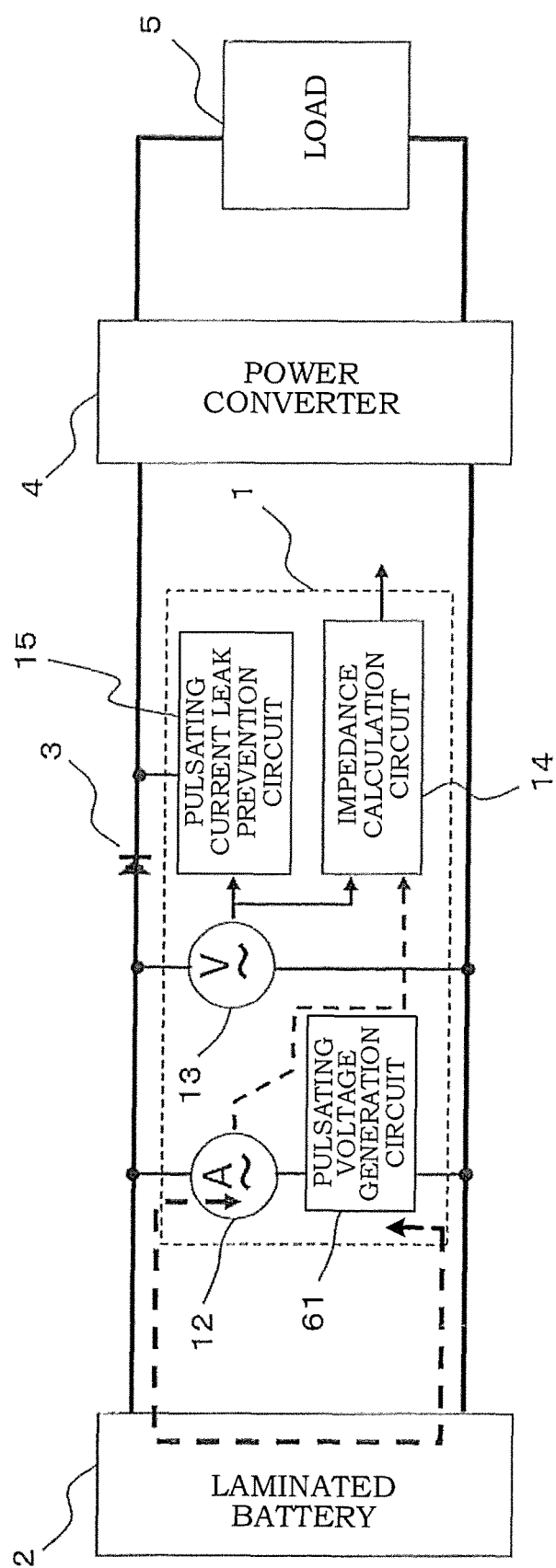
FIG. 6 illustrates a configuration of an apparatus for measuring an impedance for a laminated battery provided with a pulsating voltage generating circuit in place of a pulsating current generating circuit.

The present invention is not limited to the embodiments described above. For example, a pulsating voltage generating circuit that generates a pulsating voltage such as a sine wave voltage may be provided in place of the pulsating current generating circuit 11. FIG. 6 illustrates a configuration in which a pulsating voltage generating circuit 61 is provided in place of the pulsating current generating circuit 11 in the apparatus for measuring an impedance of a laminated battery shown in FIG. 1. In this case, a pulsating voltage generated by the pulsating voltage generating circuit 61 is also superimposed on an output voltage of a laminated battery 2. Further, a pulsating current detector 12 detects a pulsating current that flows due to the pulsating voltage generated by the pulsating voltage generating circuit 61, and a pulsating voltage detector 13 detects the pulsating voltage.

It has been explained above that the pulsating current leak preventing circuit 15 suppresses the pulsating potential difference between the both ends of the diode 3 provided between the pulsating current generating circuit 11 and the load 5. However, even in a configuration in which a resistance component other than the diode 3 is provided between the pulsating current generating circuit 11 and the load 5, the pulsating current can be prevented from flowing to the load 5 via the resistance component so long as the pulsating potential difference between both ends of the resistance component is suppressed by the pulsating current leak preventing circuit 15.

The sine wave current has been explained above as one example of the pulsating current. However, the pulsating current is not limited to a sine wave current. Similarly, the pulsating voltage is also not limited to a sine wave voltage.

As described above, although the embodiments of the present invention have been explained, the above embodiments merely illustrate a part of examples of application of the present invention, and they do not mean that a technical scope of the present invention is limited to a specific configuration of each of the above embodiments.

The present application claims priority based on Japanese Patent Application No. 2013-177827 filed with the Japan Patent Office on Aug. 29, 2013, the entire content of which is incorporated into this specification by reference.

The invention claimed is:

1. An apparatus for measuring an impedance of a laminated battery, comprising:

a laminated battery in which a plurality of power generating elements is laminated;

a load connected to both ends of the laminated battery;

a superimposing unit configured to superimpose a pulsating current or a pulsating voltage on an output of the laminated battery;

an impedance measuring unit configured to measure an internal impedance of the laminated battery on the basis of, when the pulsating current is superimposed on the output, the pulsating current and a pulsating voltage generated by superimposing the pulsating current, or on the basis of, when the pulsating voltage is superimposed on the output, the pulsating voltage and a pulsating current generated by superimposing the pulsating voltage;

a resistance component provided between the superimposing unit and the load; and a potential difference suppressing circuit configured to suppress a pulsating potential difference between both ends of the resistance component.

2. The apparatus for measuring an impedance of a laminated battery according to claim 1, wherein the potential difference suppressing circuit suppresses the pulsating potential difference between the both ends of the resistance component by applying the pulsating voltage to a load-side end of the both ends of the resistance component.

3. The apparatus for measuring an impedance of a laminated battery according to claim 1, wherein the potential difference suppressing circuit is a negative feedback amplifier circuit comprising:

a non-inverted input terminal connected to a laminated battery-side end of the both ends of the resistance component;

an inverted input terminal connected to a load-side end of the both ends of the resistance component; and an output terminal connected to the inverted input terminal.

4. The apparatus for measuring an impedance of a laminated battery according to claim 1, wherein the superimposing unit comprises:

a pulsation generating unit configured to generate a pulsating current or a pulsating voltage; and a transformer including a primary coil and a secondary coil, the primary coil being connected to the pulsation generating unit, the secondary coil being connected to a circuit into which an output current of the laminated battery flows.

5. The apparatus for measuring an impedance of a laminated battery according to claim 1, wherein the superimposing unit comprises:

a pulsation generating unit configured to generate a pulsating current or a pulsating voltage; and a differential amplifier circuit including two input terminals, the two input terminals being respectively connected to both ends of the pulsation generating unit.

6. The apparatus for measuring an impedance of a laminated battery according to claim 1, further comprising:

a power converting unit provided between the superimposing unit and the load, wherein the superimposing unit includes a thermoelectric element that generates the pulsating current or the pulsating voltage due to thermal fluctuation according to switching of a switching element included in the power converting unit.

7. A method of measuring an impedance of a laminated battery, a plurality of power generating elements being laminated in the laminated battery, a load being connected to both ends of the laminated battery, the method comprising:

using a superimposing unit configured to superimpose a pulsating current or a pulsating voltage on an output of the laminated battery to measure an internal impedance of the laminated battery on the basis of, when the pulsating current is superimposed, the pulsating current and a pulsating voltage generated by superimposing the pulsating current, or on the basis of, when the pulsating voltage is superimposed, the pulsating voltage and a pulsating current generated by superimposing the pulsating voltage;

providing a resistance component between the superimposing unit and the load; and suppressing a pulsating potential difference between both ends of the resistance component.

\* \* \* \* \*